US009817077B2

(12) United States Patent
Yamada

(10) Patent No.: US 9,817,077 B2
(45) Date of Patent: Nov. 14, 2017

(54) CIRCUIT DEVICE AND ELECTRONIC APPARATUS

(71) Applicant: SEIKO EPSON CORPORATION, Tokyo (JP)

(72) Inventor: Atsushi Yamada, Nagoya (JP)

(73) Assignee: SEIKO EPSON CORPORATION, Tokyo (JP)

( * ) Notice: Subject to any disclaimer, the term of this patent is extended or adjusted under 35 U.S.C. 154(b) by 244 days.

(21) Appl. No.: 14/611,650

(22) Filed: Feb. 2, 2015

(65) Prior Publication Data

US 2015/0234001 A1 Aug. 20, 2015

(30) Foreign Application Priority Data

Feb. 18, 2014 (JP) .................................. 2014-028251

(51) Int. Cl.
*G01R 31/40* (2014.01)
*H02H 7/08* (2006.01)
*H02P 29/024* (2016.01)
*H02P 7/03* (2016.01)

(52) U.S. Cl.
CPC .......... *G01R 31/40* (2013.01); *H02H 7/0838* (2013.01); *H02P 29/0241* (2016.02); *H02P 7/04* (2016.02)

(58) Field of Classification Search
CPC ........ H02H 7/0838; H02H 3/093; H02H 3/20; H02H 3/24; H02H 3/247; H02P 29/024; H02P 29/0241; H02P 29/032; H02P 7/04; G01R 31/26; G01R 31/2601; G01R 31/2607; G01R 31/2621; G01R 31/40
See application file for complete search history.

(56) References Cited

U.S. PATENT DOCUMENTS

| 7,843,675 | B2 | 11/2010 | Hirata | |
|---|---|---|---|---|
| 2008/0315804 | A1* | 12/2008 | Nishibe | ................... B60R 1/074 318/256 |
| 2010/0073039 | A1* | 3/2010 | Kanai | ................. H02M 7/5387 327/110 |
| 2012/0044020 | A1* | 2/2012 | Siniscalchi | ........... H03F 3/2173 330/251 |
| 2014/0055072 | A1* | 2/2014 | Usui | ........................ H02P 7/00 318/519 |

FOREIGN PATENT DOCUMENTS

JP 2007074794 A 3/2007

\* cited by examiner

*Primary Examiner* — Huy Q Phan
*Assistant Examiner* — Dustin Dickinson
(74) *Attorney, Agent, or Firm* — Oliff PLC

(57) ABSTRACT

A circuit device includes an output circuit having a high-side transistor and a low-side transistor, and a control circuit configured to detect a voltage between the drain node and the source node of a detection target transistor that is at least one of the low-side transistor and the high-side transistor, and detect a malfunction in the case where it is determined that the detection voltage did not exceed a given comparison voltage.

19 Claims, 13 Drawing Sheets

CIRCUIT DEVICE AND ELECTRONIC APPARATUS

BACKGROUND

1. Technical Field

The present invention relates to a circuit device, an electronic apparatus, and the like.

2. Related Art

A method of performing PWM control of transistors in an H bridge circuit is known as a method for controlling the torque of a motor. With this method, a charge period in which the output current of the H bridge circuit increases and a decay period in which the output current of the H bridge circuit decreases are repeated, and the driving current for the motor is controlled by controlling the lengths of the periods.

In the case of performing this kind of control, a malfunction detection circuit is provided in order to protect the motor and the H bridge from malfunctions caused by excess current. For example, JP-A-2007-74794 discloses a technique in which a first sense resistor is provided on the power supply side of an H bridge and a second sense resistor is provided on the ground side of the H bridge, and excess current is detected by detecting the voltage between both ends of the first sense resistor and the voltage between both ends of the second sense resistor.

In JP-A-2007-74794, an increase in the voltage between both ends of the sense resistor in the case where excess current flows in the sense resistor is detected as a malfunction. However, if a current path other than the sense resistor is generated, excess current can no longer be correctly detected. For example, in the case of breakdown of the junction between the drain of the transistor in the H bridge and the substrate due to excess voltage, part of the excess current will flow in the substrate, and the voltage increase in the sense resistor will be smaller.

Thus, the method of detecting a voltage increase when excess current flows in a resistor is problematic in that in the case of breakdown of a transistor, excess current that flows due to the breakdown of the transistor cannot be detected as a malfunction.

According to some aspects of the invention, it is possible to provide a circuit device, an electronic apparatus, and the like, according to which it is possible to detect excess current caused by breakdown of a transistor.

SUMMARY

One aspect of the invention relates to a circuit device including a bridge circuit having a high-side transistor and a low-side transistor; a malfunction detection circuit configured to detect whether or not a detection voltage, which is a voltage between a drain node and a source node of a detection target transistor that is at least one of the high-side transistor and the low-side transistor, exceeds a given comparison voltage; and a control circuit configured to detect a malfunction in the case where it is determined based on the detection result from the malfunction detection circuit that the detection voltage did not exceed the given comparison voltage before completion of a charge period, in which an output current of the bridge circuit is increased.

According to one aspect of the invention, a malfunction is detected in the case where the detection voltage, which is the voltage between the drain node and the source node of the detection target transistor, does not exceed the given comparison voltage before the completion of the charge period.

If there is no malfunction, it is expected that the detection voltage will exceed the given comparison voltage before the completion of the charge period, and therefore, according to one aspect of the invention, it is possible to detect excess current caused by breakdown of a transistor.

Also, in one aspect of the invention, the given comparison voltage may be a voltage that changes according to a setting value for a chopping current, which is an output current of the bridge circuit at completion of the charge period.

The bridge circuit drives a DC motor, for example. In this case, the torque of the DC motor can be controlled by changing the setting value for the chopping current. In this type of case, a lower-limit voltage to be reached, which is estimated based on the setting value for the chopping current, can be set by setting the given comparison voltage in accordance with the setting value for the chopping current. Then, if the voltage is not reached, it is possible to determine that a malfunction has occurred.

Also, in one aspect of the invention, the control circuit may determine, at the elapse of a period equal to a past charge period that was monitored or a pre-set period, whether or not the detection voltage has exceeded the given comparison voltage based on the detection result from the malfunction detection circuit.

The charge period is complete when it is detected that the output current of the bridge circuit has reached the setting value for the chopping current, for example. However, if there is a malfunction, the setting value for the chopping current will not be reached, and therefore the completion of the charge period cannot be detected. For this reason, the elapse of a period equal to the past charge period that was monitored or the pre-set period is considered to be the completion of the charge period, and it is thereby possible to perform malfunction detection.

Also, in one aspect of the invention, the malfunction detection circuit may have a current supply circuit and a voltage output transistor whose drain receives input of the current from the current supply circuit and whose source is connected to the source of the detection target transistor, and may output the drain voltage of the voltage output transistor as the given comparison voltage.

By thus inputting the current from the current supply circuit to the drain of the voltage output transistor, the current is converted to a voltage according to the on-resistance thereof and can be output as the given comparison voltage. The on-resistance ratio between the voltage output transistor and the detection target transistor is determined by using a transistor, and therefore can be set by replacing the relationship between the detection voltage and the given comparison voltage with the relationship between the currents.

Also, in one aspect of the invention, the current from the current supply circuit may be set according to the setting value for the chopping current, which is the output current of the bridge circuit at completion of the charge period.

As described above, since the relationship between the detection voltage and the given comparison voltage can be replaced with the relationship between the currents, a given comparison voltage that is appropriate according to the setting value for the chopping current can be set by setting the current from the current supply circuit with respect to the setting value for the chopping current.

Also, in one aspect of the invention, if the size ratio between the voltage output transistor and the detection target transistor is 1/n, n being a natural number greater than or equal to 2, the malfunction detection circuit may set the current from the current supply circuit to be less than or equal to 1/n the setting value for the chopping current.

The ratio between the on-resistances is 1/n according to the size ratio between the voltage output transistor and the detection target transistor. According to the ratio between the on-resistances, it is possible to determine the relationship between the setting value for the chopping current and the output current of the current supply circuit. In other words, by setting it to be less than or equal to 1/n the setting value for the chopping current, it is possible to determine whether or not the setting value for the chopping current is reached before the completion of the charge period, and a malfunction can be detected.

Also, in one aspect of the invention, the malfunction detection circuit may have a comparator that is constituted by a transistor with a first breakdown voltage and is configured to compare the detection voltage and the given comparison voltage, and the high-side transistor and the low-side transistor may be transistors with a second breakdown voltage that is greater than the first breakdown voltage.

By thus providing the comparator, the detection voltage and the given comparison voltage can be compared and it can be determined whether or not the detection voltage exceeded the given comparison voltage before the completion of the charge period.

In one aspect of the invention, the malfunction detection circuit may have a switch circuit that is constituted by a transistor with the second breakdown voltage and is provided between the drain node of the detection target transistor and an input terminal for the detection voltage of the comparator, and the switch circuit may be switched off in a decay period, in which the output current of the bridge circuit is reduced.

As described above, the transistors of the bridge circuit have the second breakdown voltage, which is greater than the first breakdown voltage. Since the drain voltage of the detection target transistor exceeds the first breakdown voltage in the decay period, by providing the switch circuit, the comparator constituted by the transistor with the first breakdown voltage can be protected.

Also, in one aspect of the invention, the control circuit controls switching on and off of the high-side transistor and the low-side transistor, and if the malfunction is detected, control of the switching on and off of the high-side transistor and the low-side transistor may be stopped.

By stopping control of the switching on and off of the bridge circuit when a malfunction is detected, it is possible to suppress a case in which excess current is output from the bridge circuit. Accordingly, it is possible to suppress a case of breakdown of the driving target of the bridge circuit due to the excess current.

Also, according to one aspect of the present invention, it is possible to include: a detection circuit configured to detect whether or not the current flowing in the bridge circuit has reached a setting value for the chopping current in the charge period; and a control circuit configured to, in the case where it is detected that the current flowing in the bridge circuit has reached the setting value for the chopping current, switch from the charge period to a decay period, in which the output current from the bridge circuit is reduced.

According to this configuration, the output of the bridge circuit can be controlled by changing the setting value for the chopping current. According to one aspect of the invention, since it is possible to detect whether or not the setting value for the chopping current that is to be reached is reached before the completion of the charge period, a malfunction can thereby be detected.

Also, in one aspect of the present invention, the detection target transistor may be the low-side transistor, a substrate of the circuit device may be a p-type substrate set to a ground voltage, and the drain node of the low-side transistor may be connected to an n-type region formed in the p-type substrate.

The junction between the p-type substrate set to the ground voltage and the drain node connected to the n-type region formed in the p-type substrate is a p-n junction. In the case of electrostatic breakdown or the like of the p-n junction, for example, a current path is generated from the drain of the low-side transistor to the ground voltage. The current path reduces the drain-source voltage of the low-side transistor. According to one aspect of the invention, by comparison with a given comparison voltage, the voltage reduction is detected, and thereby the malfunction can be detected.

In one aspect of the invention, the detection target transistor may be the high-side transistor, the substrate of the circuit device may be a p-type substrate, the n-type region formed in the p-type substrate may be set to the power supply voltage, and the drain node of the high-side transistor may be connected to the p-type region formed in the n-type region.

The junction between the n-type region set to the power supply voltage and the drain node connected to the p-type region formed in the n-type region is a p-n junction. In the case of electrostatic breakdown or the like of the p-n junction, for example, a current path is generated from the power supply voltage to the drain of the high-side transistor. The current path reduces the drain-source voltage of the high-side transistor. According to one aspect of the invention, by comparison with a given comparison voltage, the voltage reduction is detected, and thereby a malfunction can be detected.

Also, in one aspect of the invention, the n-type region may be formed by an n-type buried layer formed in the p-type substrate and an n-type well formed on the n-type buried layer.

This type of structure is used in a DMOS (Double-Diffused MOSFET) transistor formed in a semiconductor substrate, for example. With this type of transistor in a semiconductor substrate, there is a possibility that a current path such as that described above will be generated. According to one aspect of the invention, it is possible to detect breakdown of a transistor that occurs when a bridge circuit is formed using these types of transistors in a semiconductor substrate.

Also, another aspect of the present invention relates to an electronic apparatus including the circuit device according to any part of the foregoing description.

BRIEF DESCRIPTION OF THE DRAWINGS

The invention will be described with reference to the accompanying drawings, wherein like numbers reference like elements.

DESCRIPTION OF EXEMPLARY EMBODIMENTS

The following describes preferred embodiments of the invention in detail. It should be noted that the embodiment to be described hereinafter is not intended to unduly limit the scope of the invention defined by the appended claims and that the entire configuration to be described in the embodiment is not necessarily essential as the means for achieving the invention.

1. Comparative Example

Figure 1:
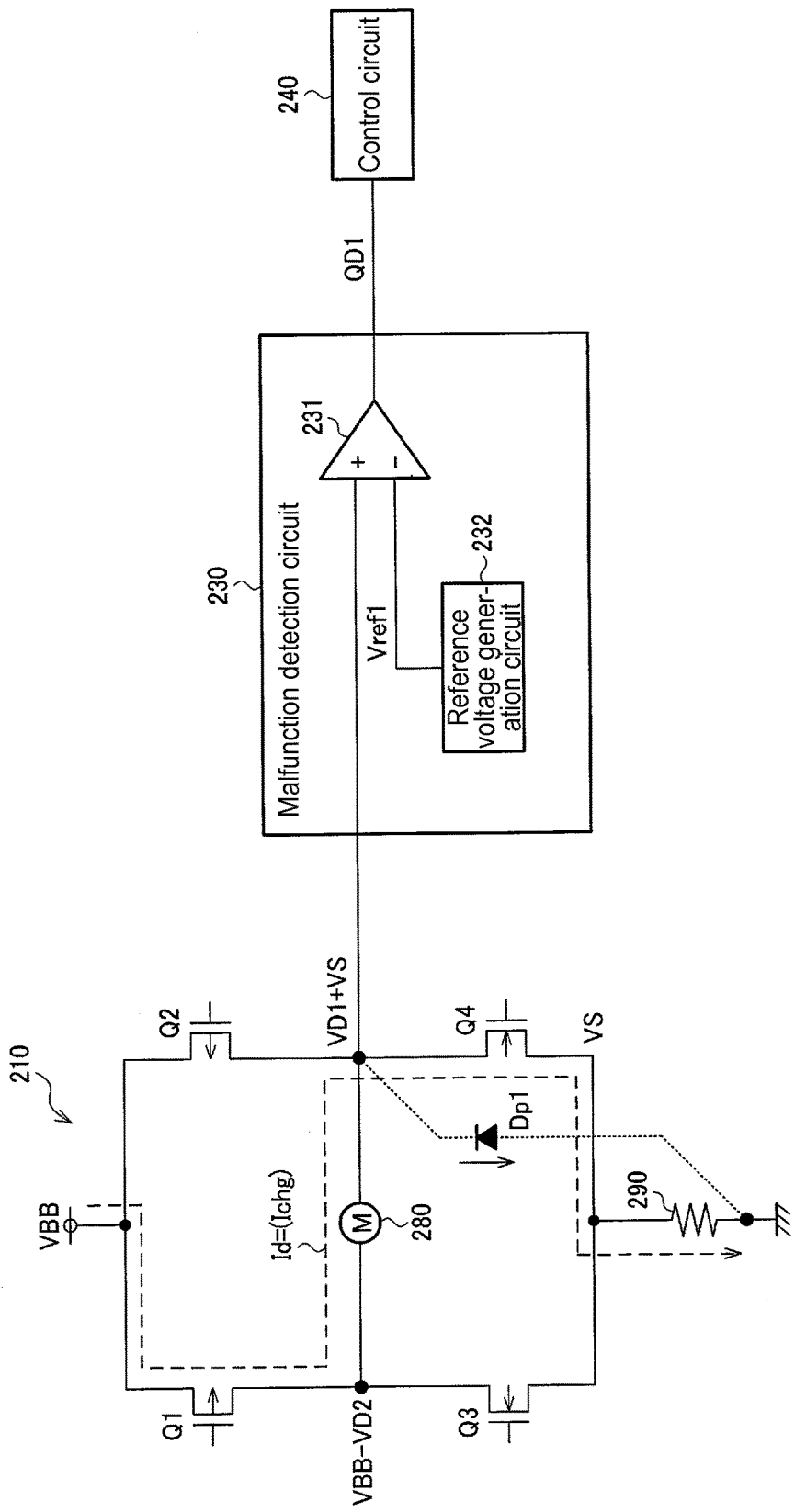
FIG. 1 shows a comparative example of a malfunction detection circuit.

FIG. 1 shows a comparative example of a malfunction detection circuit according to the present embodiment. A malfunction detection circuit 230 includes a reference voltage generation circuit 232 that outputs a reference voltage Vref1, and a comparator 231 that compares the reference voltage Vref1 and a drain voltage VD1+VS of a transistor Q4. Here, VD1 is the voltage between the source and the drain of the transistor Q4.

Figure 3:
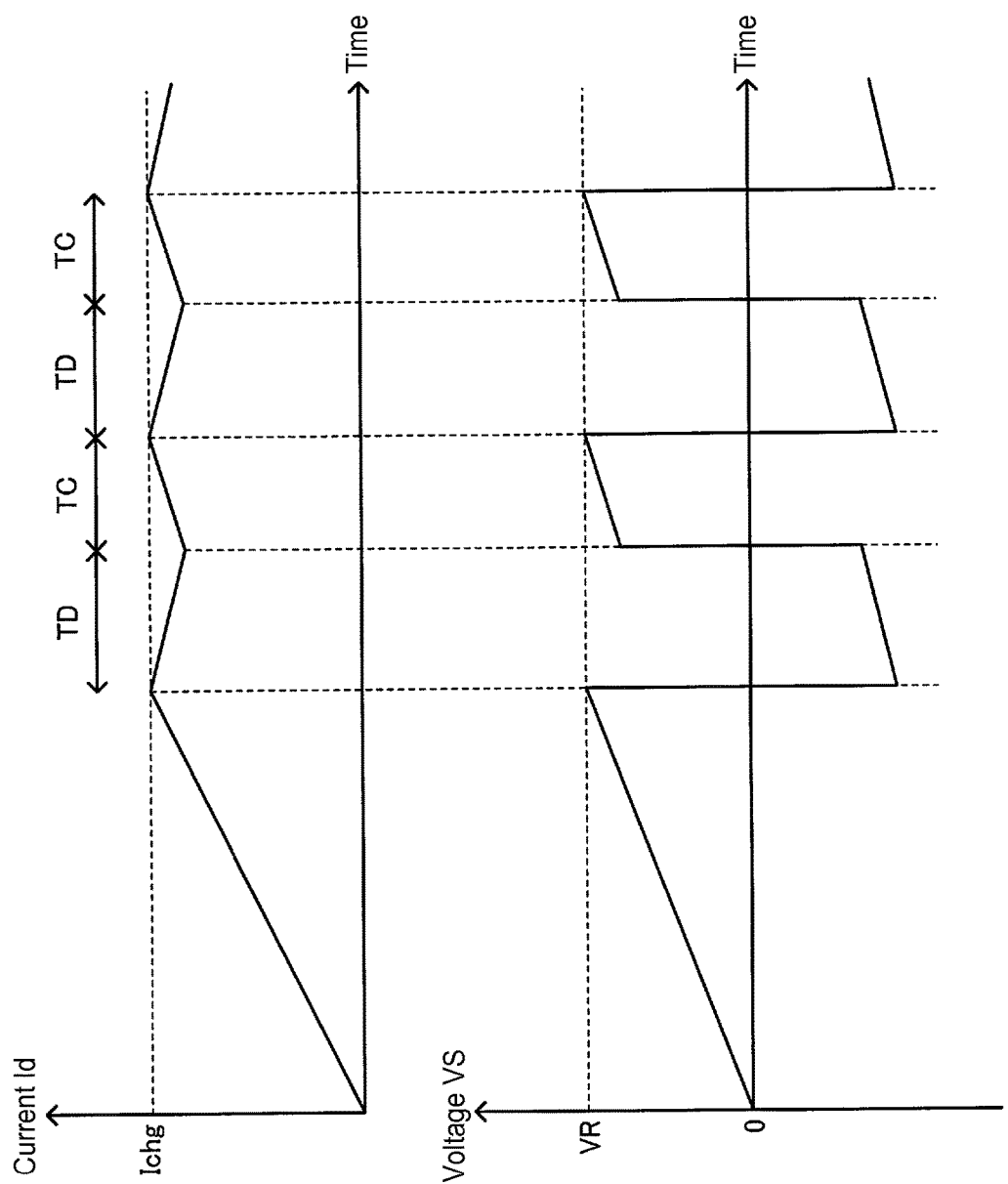
FIG. 3 shows a diagram for describing an operation of a circuit device according to an embodiment.

As will be described later with reference to FIG. 3, in a charge period, transistors Q1 and Q4 in a bridge circuit 210 are on, and a current Id flowing in a motor 280 increases. The current Id reaches its maximum when switching to a decay period is performed, and the maximum value thereof is referred to as "chopping current Ichg". If there is some malfunction (e.g., short-circuiting of a terminal, breakdown of transistors Q1 to Q4, etc.) in the bridge circuit 210, a current that exceeds the expected chopping current Ichg will flow in the motor 280 and the bridge circuit 210. Since this kind of excess current causes damage to the motor 280, if excess current that exceeds a predetermined value flows, driving of the bridge circuit 210 is stopped so as to prevent damage to the motor 280.

In the comparative example shown in FIG. 1, if the drain voltage VD1+VS of the transistor Q4 exceeds the reference voltage Vref1, the comparator 231 makes a signal QD1 active, and upon receiving the signal QD1, the control circuit 240 stops the driving of the bridge circuit 210. The reference voltage Vref1 is a voltage that corresponds to the current value for excess current that causes the driving to be stopped. In other words, if it is desired that the driving is stopped at a current value Imax, the reference voltage is set to Vref1=Imax·(Ron4+Rsens). Ron4 is the on-resistance of the transistor Q4, and Rsens is the resistance value of a sense resistor 290.

Thus, in the comparative example, the malfunction is detected when VD1+VS>Vref1. However, this is based on the premise that the excess current will flow between the drain and source of the transistor Q4 and the drain voltage VD1+VS will increase due to the on-resistance Ron4. For this reason, there is a problem in that if part of the excess current branches to another current path (or the entirety of the excess current flows to another current path), the increase in the drain voltage VD1+VS is suppressed and excess current that is greater than or equal to the predetermined value flows in the motor 280.

For example, it is conceivable that the junction between the drain of the transistor Q4 and the substrate will undergo electrostatic breakdown to form another current path. As will be described later with reference to FIG. 11, if the bridge circuit 210 is integrated in a semiconductor substrate, a parasitic diode Dp1 exists between the drain of the n-type transistor Q4 and the substrate. In the case of breakdown of the p-n junction, since the substrate is connected to the ground, a current path will be generated from the drain of the transistor Q4 to the ground. If the excess current branches to this path, the excess current flowing between the drain and source of the transistor Q4 will decrease.

Also, there is a problem in that if a current path such as that described above is generated, it cannot be detected as a malfunction of the transistor Q4. Specifically, by detecting a drain voltage VBB−VD2 of the transistor Q1 using a similar malfunction detection circuit, it is possible to detect excess current flowing in the transistor Q1 as well. At this time, in the case of breakdown of the parasitic diode Dp1 of the transistor Q4, the excess current thereby flows in the transistor Q1. For this reason, regardless of the breakdown of the transistor Q4, the excess current is detected using a malfunction detection circuit on the transistor Q1 side. Based on the result of the malfunction detection, the cause of the excess current cannot be known, and therefore it is also unclear that the transistor Q4 has broken down.

2. Circuit Device (Claim 1, 10)

Figure 2:
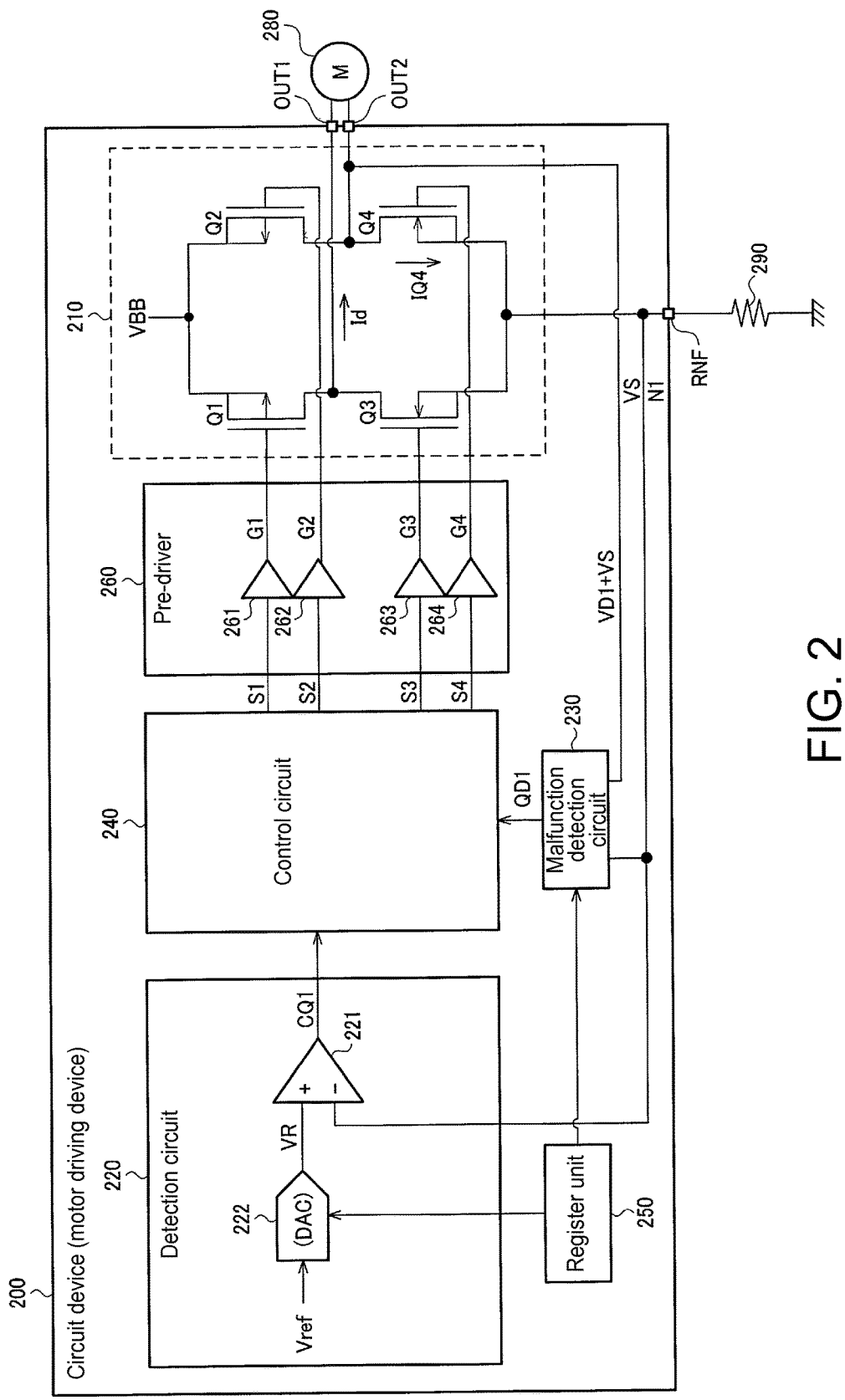
FIG. 2 shows an example of a configuration of a circuit device according to an embodiment.

FIG. 2 shows an example of a configuration of the circuit device according to the present embodiment, according to which the foregoing problems can be resolved. A circuit device 200 includes a bridge circuit 210, a detection circuit 220, a malfunction detection circuit 230, a control circuit 240, a register unit 250, and a pre-driver 260.

First, a basic configuration and operations for driving the motor 280 will be described.

The bridge circuit 210 is a circuit that supplies a driving current to the motor 280 (e.g., a DC motor, a stepping motor). Specifically, the bridge circuit 210 includes the high-side transistors Q1 and Q2, which are connected to a high-potential power supply (power supply voltage VBB) side, and the low-side transistors Q3 and Q4, which are connected to the low-potential power supply (ground voltage) side.

The transistors Q1 to Q4 are MOS transistors, and for example, the transistors Q1 and Q2 are p-type transistors and the transistors Q3 and Q4 are n-type transistors. The transistors Q1 to Q4 are configured to form an H bridge. In other words, the source nodes of the transistors Q1 and Q2 are connected to the node of the power supply voltage VBB, and the source nodes of the transistors Q3 and Q4 are connected to a first node N1, which is connected to a third terminal RNF. One end of a sense resistor 290 is connected to the third terminal RNF. The drain nodes of the transistors Q1 and Q3 are connected to a terminal OUT1, to which one end of the motor 280 is connected. The drain nodes of the transistors Q2 and Q4 are connected to a terminal OUT2, to which the other end of the motor 280 is connected.

Here, a description will be given using, as an example, a case in which the transistors Q1 and Q2 are constituted by p-type transistors, but all of the transistors Q1 to Q4 may be constituted by n-type MOS transistors.

Based on a voltage VS at one end of the sense resistor 290, the detection circuit 220 detects the current Id output by the bridge circuit 210. Specifically, the detection circuit 220 includes a D/A conversion circuit 222 that outputs a reference voltage VR and a comparator 221 that compares the reference voltage VR and the voltage VS at one end of the sense resistor 290.

The control circuit 240 outputs PWM signals S1 to S4 (control signals) based on a signal CQ1, which is the comparison result from the comparator 221, and controls switching on and off of the transistors Q1 to Q4 using the PWM signals S1 to S4.

The pre-driver 260 includes buffers 261 to 264. The buffers 261 to 264 buffer the PWM signals S1 to S4 and output them to the gates of the transistors Q1 to Q4 as driving signals G1 to G4.

An operation for driving the motor 280 will be described next with reference to FIG. 3. In a charge period TC, the control circuit 240 switches on the transistors Q1 and Q4 of the bridge circuit 210 and switches off the transistors Q2 and Q3. At this time, the current Id (charge current) flowing in the motor 280 increases, and therefore the voltage VS increases. Upon detecting that the voltage VS has reached the reference voltage VR, the comparator 221 makes the signal CQ1 active. The control circuit 240 receives the active signal CQ1 and switches from the charge period TC to a decay period TD. The current at the time when the voltage VS reaches the reference voltage VR is referred to as the chopping current Ichg.

In the decay period TD, the control circuit 240 switches on the transistors Q2 and Q3 of the bridge circuit 210 and switches off the transistors Q1 and Q4. At this time, the current Id (decay current) flowing in the motor 280 decreases. The control circuit 240 counts the elapse of a predetermined amount of time using a counter, for example, and switches from the decay period TD to the charge period TC.

By doing so, the current Id flowing in the motor 280 increases and decreases with the chopping current Ichg as the upper limit, and the average thereof is the driving current of the motor 280. Since the chopping current Ichg is determined according to the reference voltage VR, the setting value for the chopping current Ichg is written in the register unit 250 from an external processing unit (processing unit 300 shown in FIG. 13) and the D/A conversion circuit 222 outputs the reference voltage VR corresponding to the setting value, for example, and it is thereby possible to control the torque of the motor 280.

Figure 4:
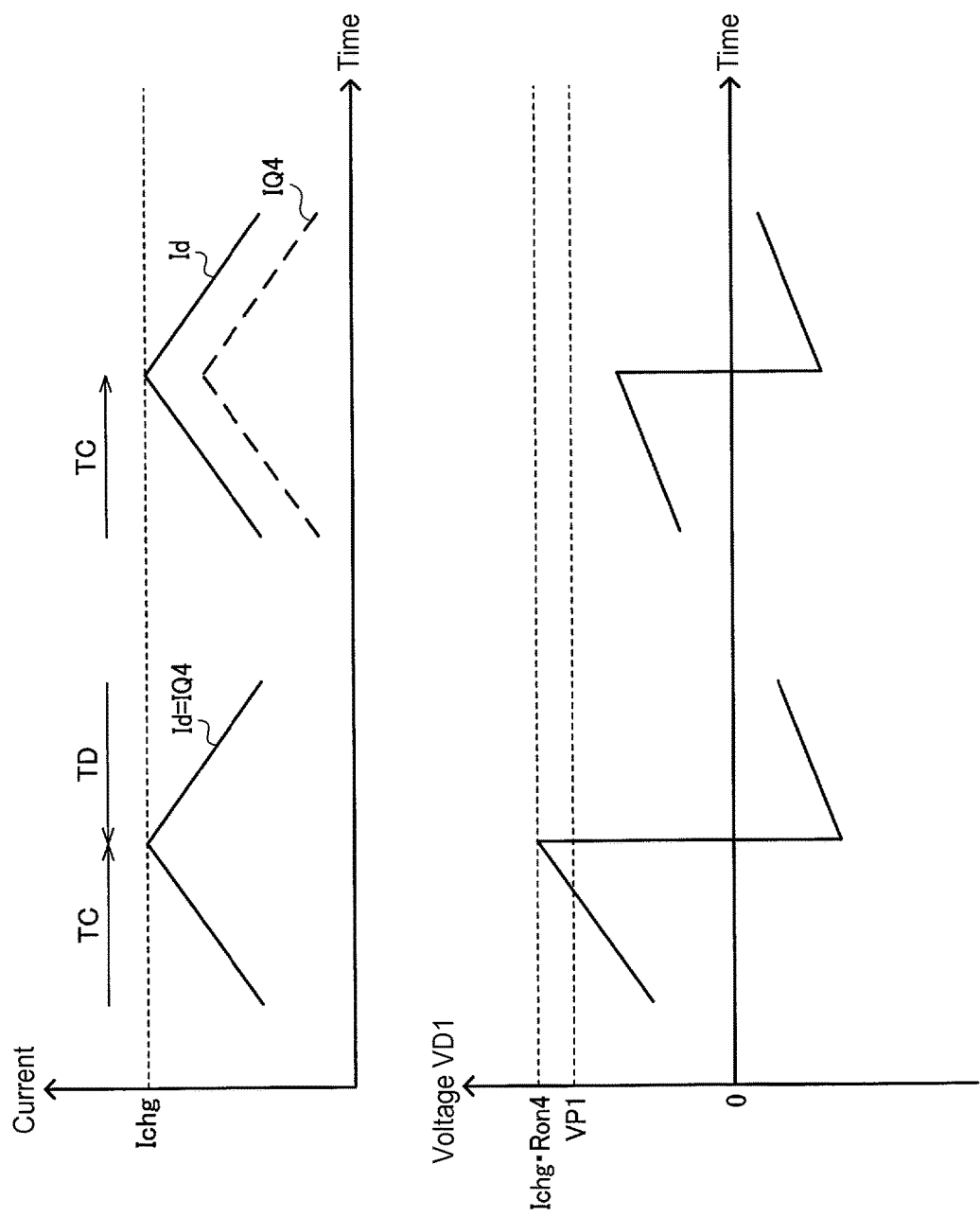
FIG. 4 shows a diagram for describing a malfunction detection operation according to an embodiment.

Next, a configuration and operation for detecting a malfunction of the bridge circuit 210 will be described. FIG. 4 shows a diagram for describing operations of the malfunction detection circuit 230.

Using the low-side transistor Q4 as the detection target transistor, the malfunction detection circuit 230 detects whether or not the voltage VD1 (detection voltage) between the drain node and the source node of the low-side transistor Q4 exceeds a given comparison voltage VP1. Then, based on the detection result from the malfunction detection circuit 230 (signal QD1), if it is determined that the detection voltage VD1 did not exceed the given comparison voltage VP1 before the completion of the charge period TC, the control circuit 240 determines that it is a malfunction. If a malfunction is determined, the control circuit 240 stops the driving of the bridge circuit 210, causing the current to stop flowing in the motor 280.

Specifically, the given comparison voltage VP1 is a voltage corresponding to the chopping current Ichg, and, letting Ron4 be the on-resistance of the transistor Q4, it is set such that VP1<Ichg·Ron4.

If the entirety of the chopping current Ichg flows between the drain and source of the transistor Q4, the drain-source current IQ4=Ichg, and therefore the drain-source voltage VD1=Ichg·Ron4. In this case, VD1>VP1 before the charge period TC ends, and therefore a malfunction is not detected.

On the other hand, if part of the chopping current Ichg flows from the drain of the transistor Q4 to the substrate, the drain-source current IQ4<Ichg, and therefore the drain-source voltage VD1<Ichg·Ron4. In this case, it is possible that VD1<VP1. In other words, if VD1<VP1 at the completion of the charge period, it is determined that the transistor Q4 has malfunctioned.

Note that if the given comparison voltage VP1 is set such that VP1=Ichg·Ron4, it will be possible to detect that VD1=VP1 exactly, but in actuality, since the chopping current Ichg more or less varies, the given comparison voltage is set such that VP1<Ichg·Ron4. For example, it is sufficient that the variation of the chopping current Ichg and the voltage VD1 at the time of breakdown of the transistor Q4 are obtained in advance using simulation and measurement and a suitable comparison voltage VP1 is set based on those results.

As described above, by detecting a malfunction in the case where the drain-source voltage VD1 of the transistor Q4 does not exceed the given comparison voltage VP1, it is possible to detect a malfunction in which a current path other than that between the drain and source of the transistor Q4 is generated. Also, in the comparative example, detection was performed using a malfunction detection circuit corresponding to the high-side transistor Q1 in the case where this kind of other current path is generated. However, according to the present embodiment, a malfunction in the transistor Q4 can be detected using a malfunction detection circuit corresponding to the transistor Q4. Accordingly, it is possible to clearly detect which transistor has malfunctioned.

Figure 9:
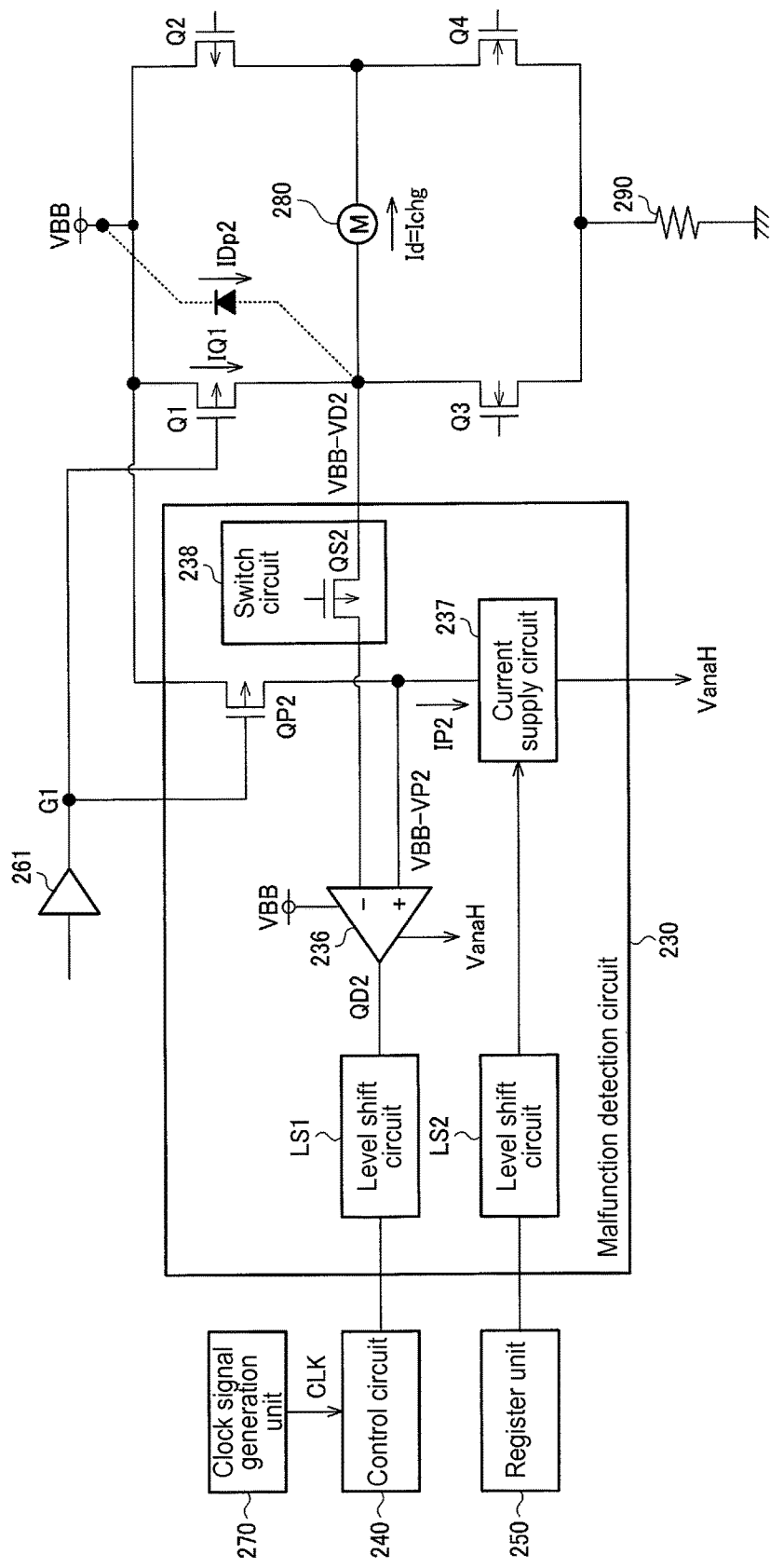
FIG. 9 shows a second detailed example of a configuration of a malfunction detection circuit.

As will be described later with reference to FIG. 9, similar malfunction detection can be performed for the high-side transistor Q1 as well. That is to say, at least one of the transistors Q1 and Q4 (Q1 and/or Q4) can be used as the detection target transistor.

(Claim 2)

As described above, the given comparison voltage VP1 is a voltage for determining whether or not the chopping current Ichg has been reached. In other words, the given comparison voltage VP1 is a voltage that changes according to the setting value for the chopping current Ichg.

Specifically, the D/A conversion circuit 222 is constituted by a resistor ladder, for example, selects a tap of the resistor ladder according to a code value set in the register unit 250, outputs the voltage of the tap as the reference voltage VR, and thereby the chopping current Ichg is determined. The malfunction detection circuit 230 sets the given comparison voltage VP1 according to the code value for the D/A conversion circuit 222 set in the register unit 250.

In the comparative example shown in FIG. 1, the upper-limit voltage Vref1 that is not to be exceeded is determined, and therefore the voltage Vref1 may be fixed and need not change in accordance with the chopping current Ichg. On the other hand, in the present embodiment, the comparison voltage VP1 is set in accordance with the setting value for the chopping current Ichg, and it is thereby possible to set a lower-limit voltage VP1 that is to be reached, which is estimated based on the setting value for the chopping current Ichg. The chopping current Ichg is changed according to the torque of the motor 280. However, a malfunction of the bridge circuit 210 can be detected regardless of the setting of the torque.

3. Details of Malfunction Detection Circuit (Claim 4, 5)

Figure 5:
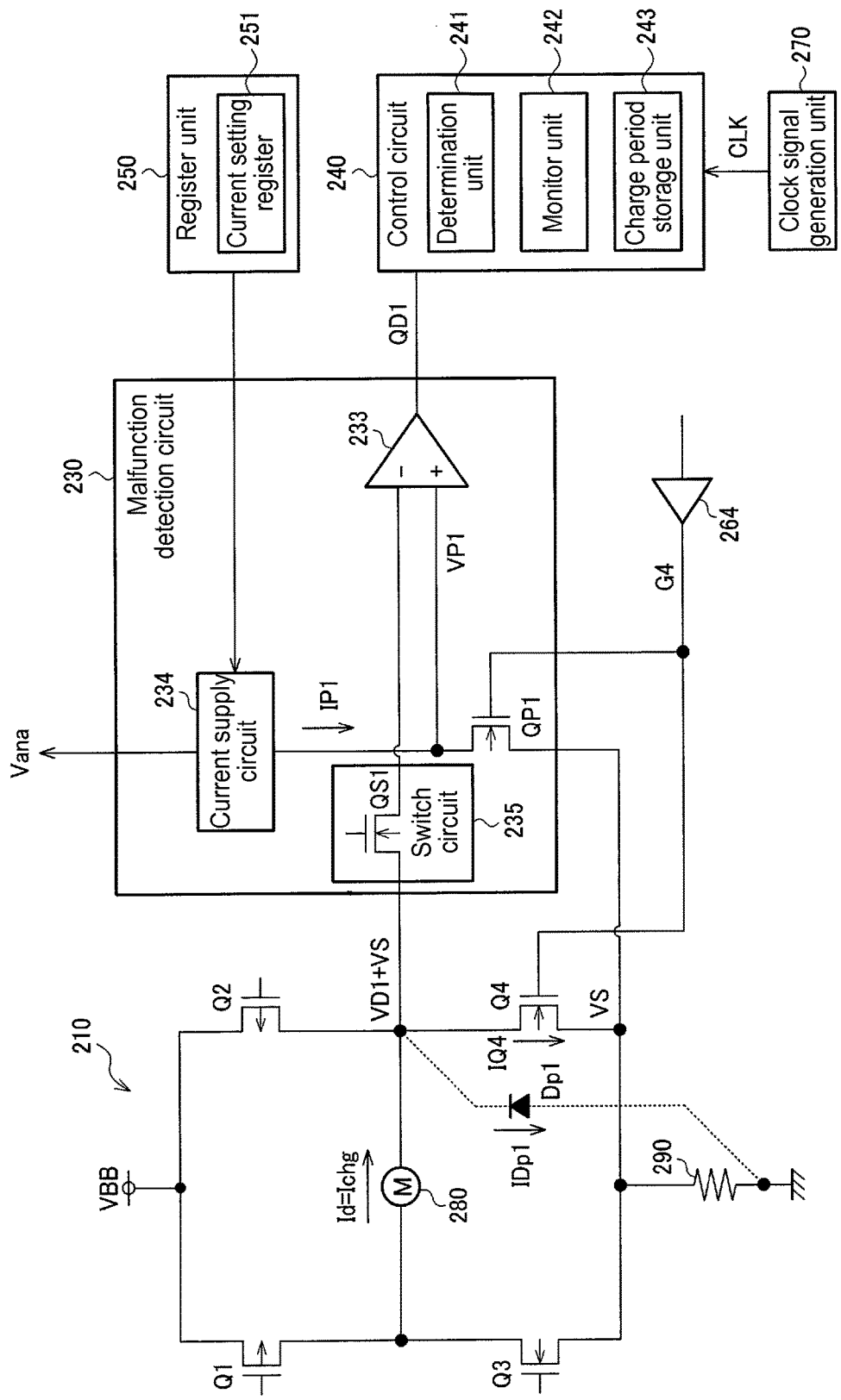
FIG. 5 shows a detailed example of a configuration of a malfunction detection circuit.

FIG. 5 shows a detailed example of the configuration of the malfunction detection circuit 230 in the case where the low-side transistor Q4 is used as the detection target. The malfunction detection circuit 230 includes the comparator 233 (comparison circuit), the current supply circuit 234, a voltage output transistor QP1, and a switch circuit 235.

The current supply circuit 234 sets a current IP1 according to the setting value for the chopping current Ichg and outputs the current IP1. The voltage output transistor QP1 is an n-type MOS transistor whose drain receives input of the current IP1 from the current supply circuit 234 and whose source is connected to the source of the detection target transistor Q4. Also, the voltage output transistor QP1 outputs the drain voltage as the given comparison voltage VP1. Note that the drain voltage of the transistor QP1 is actually VP1+VS, but the source is connected to the node of the voltage VS, which is used in common by the source of the transistor Q4. For this reason, VP1 is the given comparison voltage to which the detection voltage VD1 is to be compared.

More specifically, the register unit 250 includes a current setting register 251 for setting the chopping current Ichg. The current supply circuit 234 outputs the current IP1 corresponding to the setting value written in the current setting register 251. Letting RonP1 be the on-resistance of the transistor QP1, VP1=IP1·RonP1 corresponding to the setting value of the chopping current Ichg is output as the comparison voltage. The transistor QP1 is switched on and off by the driving signal Q4 from the buffer 264, similarly to the transistor Q4. That is to say, in the charge period, the aforementioned comparison voltage VP1 is output.

In this way, the current supply circuit 234 outputs the current IP1, which corresponds to the setting value for the chopping current Ichg, and it is thereby possible to cause the given comparison voltage VP1 to change in accordance with the chopping current Ichg, and a suitable comparison voltage VP1 for each setting value can be obtained. Also, by inputting the current IP1 to the voltage output transistor QP1, current-to-voltage conversion is performed according to the on-resistance, and it is possible to output the comparison voltage VP1 corresponding to the current IP1.

(Claim 6)

The current IP1 and the on-resistance RonP1 of the transistor QP1 are set as follows. That is to say, the size ratio between the voltage output transistor QP1 and the detection target transistor Q4 is 1/n (n is a natural number greater than or equal to 2). Then, the current IP1 from the current supply circuit 234 is set to be less than or equal to 1/n the setting value for the chopping current Ichg.

Specifically, gate lengths L of the transistors QP1 and Q4 are set to be the same, and the gate width W of the transistor QP1 is set to 1/n the gate width W of the transistor Q4. By doing so, the on-resistance RonP1=n·Ron4. The comparison voltage is such that VP1=RonP1·IP1≤n·Ron4·(1/n)·Ichg=Ron4·Ichg, and it is possible to set a comparison voltage VP1 that is correct and corresponds to the setting value for the chopping current Ichg.

(Claim 7, 8)

The comparator 233 compares the thus-set comparison voltage VP1 and the detection voltage VD1=Ron4·Id, which is the drain voltage of the transistor Q4. Specifically, the voltage VP1+VS is input to the non-inverting input terminal of the comparator 233, and the voltage VD1+VS is input to the inverting input terminal of the comparator 233. In the case where VD1+VS>VP1+VS, or in other words, VD1>VP1, the comparator 233 outputs the H-level signal QD1.

The comparator 233 is constituted by a transistor with a first breakdown voltage. The first breakdown voltage is a so-called low breakdown voltage, which is a breakdown voltage used, for example, when a power supply voltage is around 5 V. On the other hand, the transistors Q1 to Q4 that constitute the bridge circuit 210, the transistor constituting the current supply circuit 234, and the voltage output transistor QP1 are transistors with a second breakdown voltage that is greater than the first breakdown voltage. The second breakdown voltage is a so-called high breakdown voltage, which is a breakdown voltage used, for example, when a power supply voltage is around 40 V. In the decay period, the transistor Q2 of the bridge circuit 210 is switched on, and therefore the voltage VD1+VS is a voltage of around 40 V, which is the same as the power supply voltage VBB. For this reason, a switch circuit 235 is provided which prevents breakdown of the comparator 233.

Specifically, the switch circuit 235 is provided between the input terminal for the detection voltage VD1+VS of the comparator 233 and the drain node of the transistor Q4. The switch circuit 235 is constituted by an n-type MOS transistor QS1 with the second breakdown voltage, whose drain (or source) is connected to the drain of the transistor Q4 and whose source (or drain) is connected to the non-inverting input terminal of the comparator 233. On and off control signals from the control circuit 240 are input to the gate of the transistor QS1, and the control circuit 240 switches on the transistor QS1 in the charge period and switches off the transistor QS1 in the decay period.

4. Malfunction Detection Operation (Claim 3, 9)

Next, a malfunction detection operation in the case of using the aforementioned malfunction detection circuit 230 will be described. As shown in FIG. 5, the control circuit 240 includes a determination unit 241 that performs determination of a malfunction based on the signal QD1 from the comparator 233, a monitor unit 242 that monitors the charge period, and a charge period storage unit 243 that stores the monitored charge period.

Figure 6:
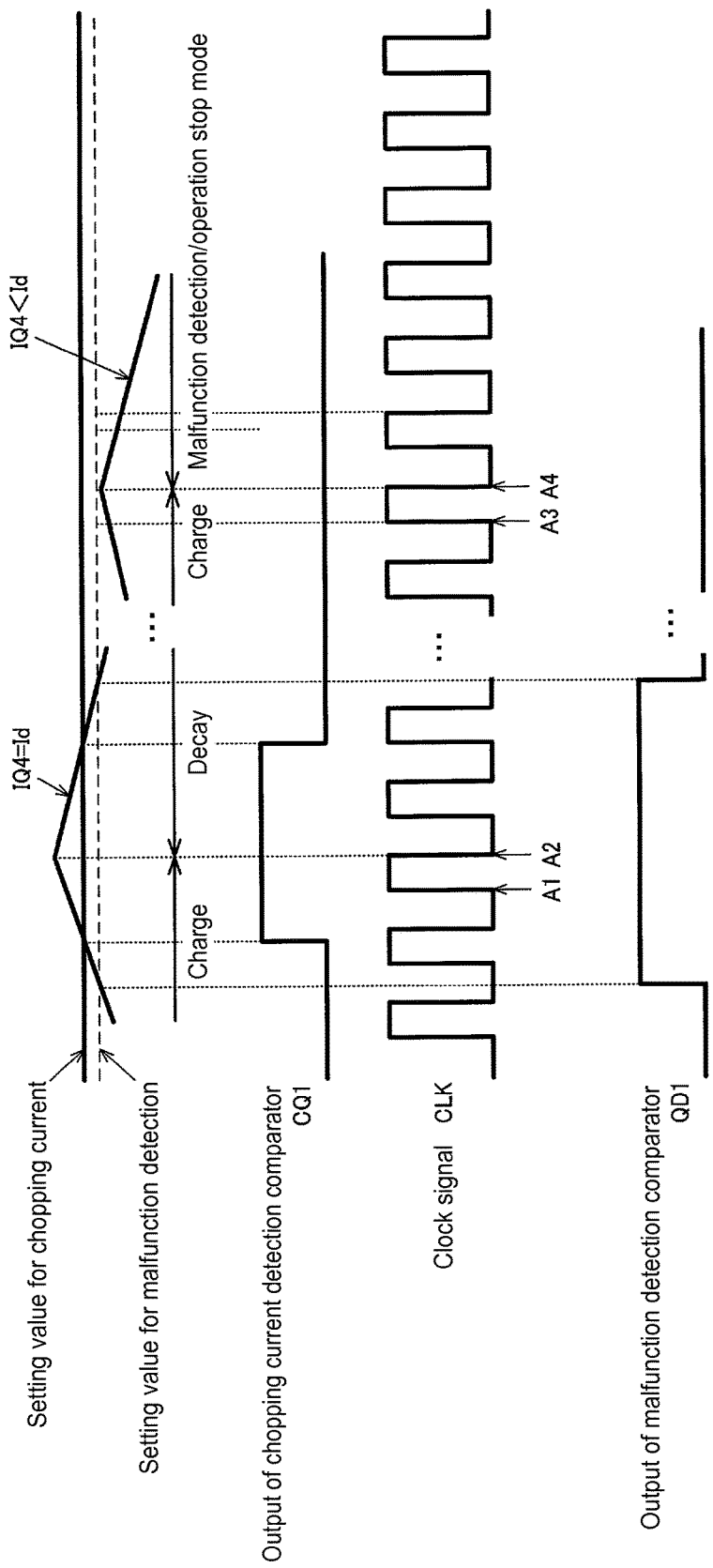
FIG. 6 is a timing chart for a malfunction detection operation performed using a detailed example of a configuration of a malfunction detection circuit.

FIG. 6 shows a timing chart for a malfunction detection operation. The control circuit 240 operates based on a clock signal CLK from a clock signal generation unit 270. The clock signal generation unit 270 is included in the circuit device 200, although it is not shown in FIG. 2.

If the diode Dp1 between the drain of the transistor Q4 and the substrate is not broken down and the drain-source current IQ4=Id, the current IQ4 exceeds the setting value for the chopping current. At this time, an output signal CQ1 of a chopping current detection comparator 221 switches from L level (inactive) to H level (active).

If it is confirmed that the signal CQ1 is H level at a rising edge of the clock signal CLK indicated by A1, the determination unit 241 checks the output signal QD1 of the malfunction detection comparator 233 at the same rising edge. Since the malfunction detection current setting value is lower than the chopping current Ichg, the signal QD1 is H level (non-active), which indicates a normal state. Upon confirmation of the fact that signal QD1 is H level, the determination unit 241 outputs a normal determination result, and based on the determination result, the control circuit 240 switches to the decay period at the falling edge (falling edge subsequent to the rising edge at A1) of the clock signal CLK indicated by A2.

In this way, if it is detected that the chopping current Ichg has been reached, it is possible to detect the completion of the charge period based on the output of the chopping current detection comparator 221, and therefore malfunction detection can be performed at that timing.

On the other hand, in the case where the diode Dp1 between the drain of the transistor Q4 and the substrate breaks down and the drain-source current IQ4<Id, the current IQ4 does not exceed the setting value for the chopping current. In this case, another method for detecting the completion of the charge period is needed. In the present embodiment, a malfunction is determined at the elapse of a period equal to a past charge period that was monitored.

Specifically, the monitor unit 242 has a counter (not shown), and counting is started when switching from the decay period to the charge period is performed. If the output signal CQ1 of the chopping current detection comparator 221 becomes active, the monitor unit 242 stores the count value at that timing in the charge period storage unit 243. The monitor operation is performed in each charge period, and the monitor results are updated. Note that the average value of multiple instances of monitor results may be stored in the charge period storage unit 243.

At the rising edge of the clock signal CLK indicated by A3 in FIG. 6, it is assumed that a charge period stored in the charge period storage unit 243 has elapsed. The determination unit 241 checks the output signal QD1 of the malfunction detection comparator 233 at that rising edge, and if the output signal QD1 is L level (active), which indicates an abnormality, the determination unit 241 outputs an abnormal determination result. Upon receiving the result, the control circuit 240 stops controlling the switching on and off of the transistors Q1 to Q4 in the bridge circuit 210 at the falling edge (falling edge subsequent to the rising edge at A3) of the clock signal CLK indicated by A4. For example, all of the transistors Q1 to Q4 are switched off, and the driving current to the motor 280 is set to zero.

Since the charge period has basically the same length each time, when in a normal state, it is expected that the chopping current Ichg will be reached at the elapse of a period equal to the past charge period that was monitored. In other words, the elapse of a period equal to the past charge period that was monitored can be considered to be the completion of the charge period, and by detecting whether or not the given comparison voltage VP1 is exceeded at that timing, malfunction detection is possible.

Figure 7:
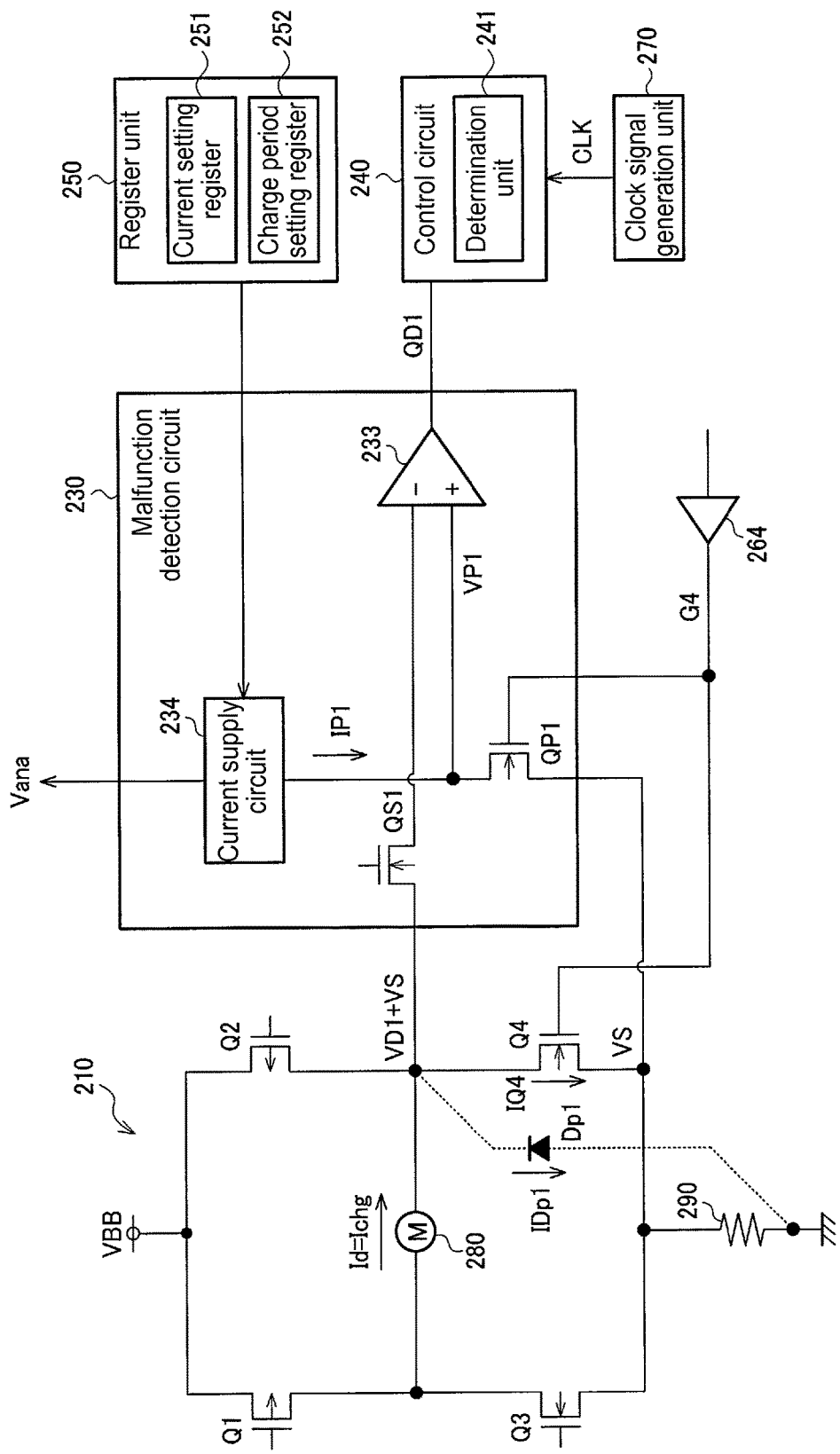
FIG. 7 shows an example of a modified configuration of a malfunction detection circuit.

Note that there is no limitation to the past charge period that was monitored, and a malfunction may be detected at the elapse of a pre-set charge period. FIG. 7 shows an example of the configuration of the register unit 250 and the control circuit 240 in this case.

The register unit 250 includes a current setting register 251 and a charge period setting register 252. The control circuit 240 includes the determination unit 241.

From an external processing unit (processing unit 300 in FIG. 13), a malfunction detection charge period is variably set in the charge period setting register 252. The determination unit 241 determines a malfunction based on the detection result from the malfunction detection circuit 230 when the period set in the charge period setting register 252 has elapsed since the switch to the charge period.

For example, it is sufficient that the motor 280 is driven using the setting values for the chopping current Ichg so that the charge periods are measured in advance, and the malfunction detection charge period corresponding to the setting value for the chopping current Ichg is set based on the measurement result.

5. Current Supply Circuit

Figure 8:
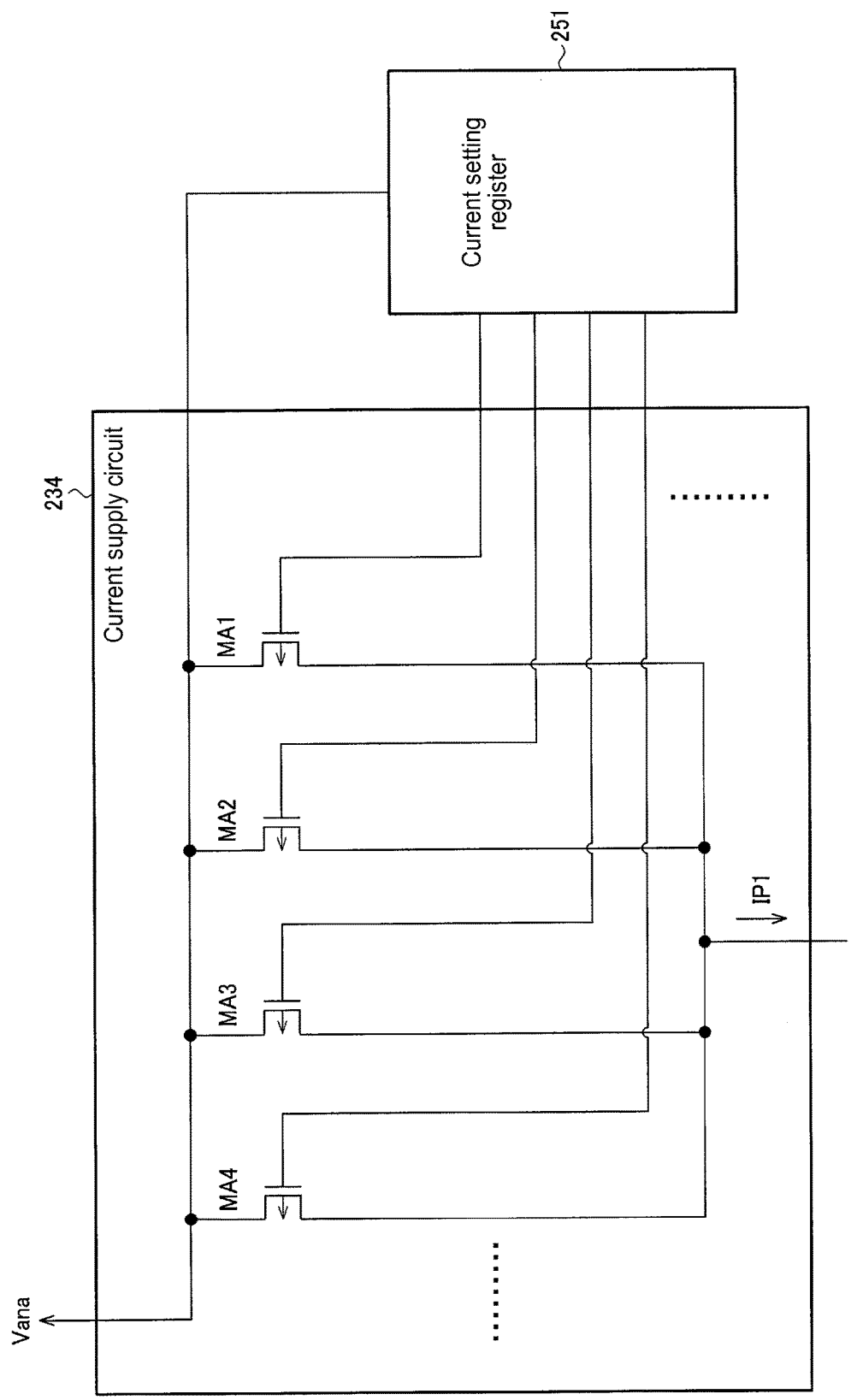
FIG. 8 shows a detailed example of a configuration of a current supply circuit.

FIG. 8 shows a detailed example of the configuration of the current supply circuit 234. The current supply circuit 234 includes first to n-th transistors MA1 to MAn, which are p-type MOS transistors. Note that only the transistors MA1 to MA4 are shown in FIG. 8.

The sources of the transistors MA1 to MAn are connected to the node of the power supply voltage VBB, and the drains thereof are connected in common to the drain of the voltage output transistor QP1. Switching on and off of the transistors MA1 to MAn is controlled according to the setting value for the chopping current Ichg set in the current setting register 251. For example, the transistors MA1 to MAn have different gate sizes, and one of the transistors MA1 to MAn is switched on according to the code value of the D/A conversion circuit 222 set in the current setting register 251. Then, the current IP1 corresponding to the transistor that was switched on is output.

6. Second Example of Configuration of Malfunction Detection Circuit

As described above, it is possible to perform malfunction detection for the high-side transistor Q1 as well. FIG. 9 shows a detailed example of the configuration of the malfunction detection circuit in this case.

The malfunction detection circuit 230 includes a comparator 236 (comparison circuit), a current supply circuit 237, a voltage output transistor QP2, and a switch circuit 238.

The current supply circuit 237 sets a current IP2 according to the setting value for the chopping current Ichg and outputs the current IP2. The voltage output transistor QP2 is a p-type MOS transistor whose drain receives input of the current IP2 from the current supply circuit 237 and whose source is connected to the source of the detection target transistor Q1 (node of the power supply voltage VBB). Also, the voltage output transistor QP2 outputs the drain voltage as a given comparison voltage VP2. Here, letting RonP2 be the on-resistance of the transistor QP2, VP2=IP2·RonP2. Note that the drain voltage of the transistor QP2 is actually VBB−VP2, but the source thereof is connected to the node of the voltage VBB, which is used in common by the source of the transistor Q1. For this reason, VP2 is the given comparison voltage to which the detection voltage VD2 is to be compared.

The transistor QP2 is switched on and off by a driving signal G1 from a buffer 261, similarly to the transistor Q1. That is to say, in the charge period, the aforementioned comparison voltage VP2 is output.

The comparator 236 compares the given comparison voltage VP2 and the detection voltage VD2, which is the drain-source voltage of the transistor Q1. Here, letting Ron1 be the on-resistance of the transistor Q1, VD2=Ron1·Id. For example, the voltage VBB−VP2 is input to the non-inverting input terminal of the comparator 236, and the voltage VBB−VD2 is input to the inverting input terminal of the comparator 236. In the case where VBB−VD2>VBB−VP2, or in other words, VD2<VP2, the comparator 236 outputs the H-level signal QD2.

The switch circuit 238 is provided between the input terminal for the detection voltage VBB−VD2 of the comparator 236 and the drain node of the transistor Q1. The switch circuit 238 is constituted by a p-type MOS transistor QS2 whose drain (or source) is connected to the drain of the transistor Q1 and whose source (or drain) is connected to the non-inverting input terminal of the comparator 236. On and off control signals from the control circuit 240 are input to the gate of the transistor QS2, and the control circuit 240 switches on the transistor QS2 in the charge period and switches off the transistor QS2 in the decay period.

The comparator 236 is constituted by a transistor with a first breakdown voltage (low breakdown voltage). On the other hand, the transistor constituting the current supply circuit 237, the voltage output transistor QP2, and the transistor QS2 of the switch circuit 238 are transistors with the second breakdown voltage (high breakdown voltage).

Figure 10:
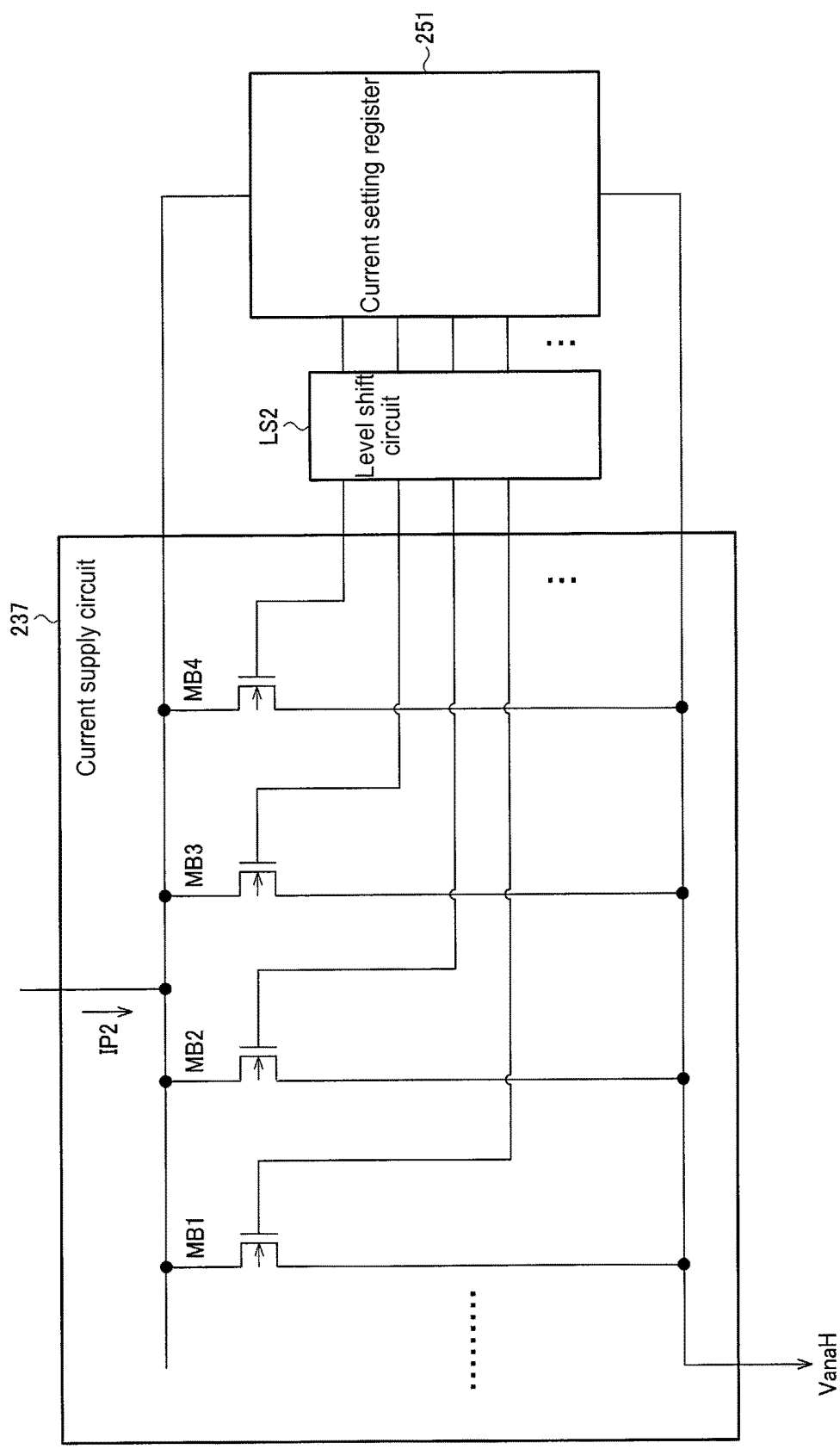
FIG. 10 shows a second detailed example of a configuration of a current supply circuit.

FIG. 10 shows a detailed example of the configuration of the current supply circuit 237. The current supply circuit 237 includes first to n-th transistors MB1 to MBn, which are n-type MOS transistors. Note that only the transistors MB1 to MB4 are shown in FIG. 10.

The sources of the transistors MB1 to MBn are connected to a node at one end of the sense resistor 290, and the drains thereof are connected in common to the drain of the voltage output transistor QP2. Switching on and off of the transistors MB1 to MBn is controlled according to the setting value for the chopping current Ichg set in the current setting register 251. For example, the transistors MB1 to MBn have different gate sizes, and one of the transistors MB1 to MBn is switched on according to the code value of the D/A conversion circuit 222 set in the current setting register 251. Then, the current IP2 corresponding to the transistor that was switched on is output.

7. Transistors in Bridge Circuit

A description was given above in which the transistors Q1 to Q4 in the bridge circuit have a parasitic diode between a drain and the substrate. An example of a configuration of a transistor having this kind of parasitic diode will be described below.

(Claims 11 to 13)

Figure 11:
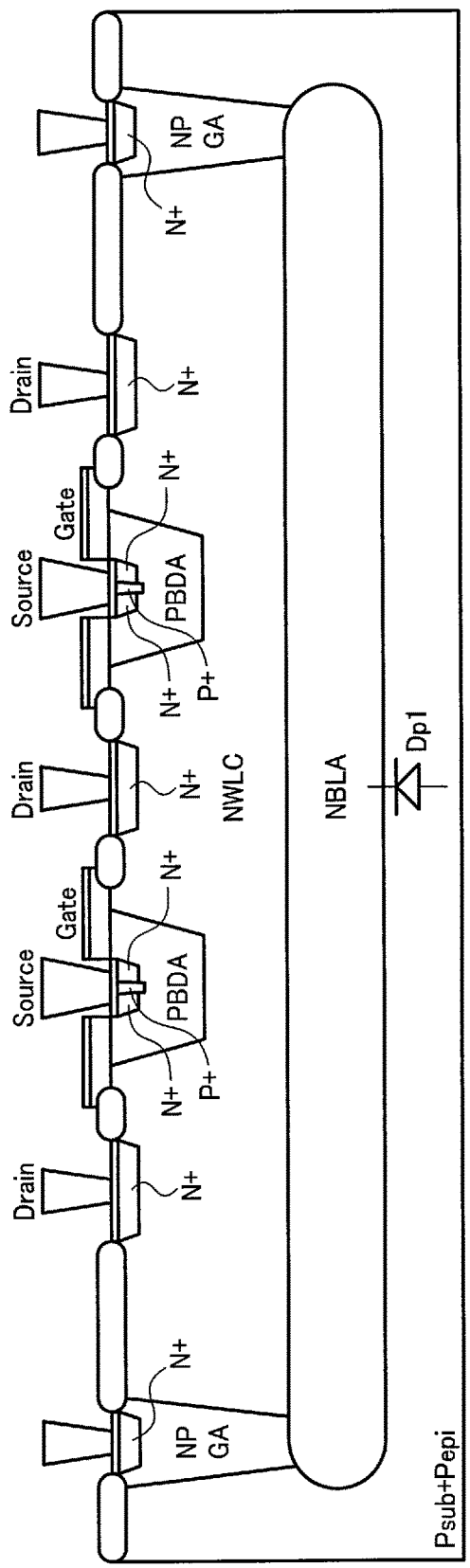
FIG. 11 is a cross-sectional view of an n-type DMOS transistor.

FIG. 11 shows an example of a cross-sectional structure of the low-side transistors Q3 and Q4. In this example, an n-type transistor with a DMOS (Double-Diffused MOSFET) structure is formed on a p-type silicon substrate.

Specifically, an n-type buried layer (NBLA) is formed in the p-type substrate (Psub), a p-type epitaxial layer is formed on the buried layer, and an n-type well (NWLC) is formed in the epitaxial layer. N-type diffusion layers are formed in the n-type well so as to form drains. Also, p-type wells (PBDA) are formed in the n-type well, and n-type diffusion layers are formed in the p-type wells so as to form sources.

The p-type substrate is set to the ground voltage (connected to the node of the ground voltage). The drains are connected to n-type regions (n-type diffusion layers), and are in contact with the p-type substrate via the n-type layers (NWLC, NBLA) below. Therefore, a parasitic diode Dp1 is generated between the drain and the p-type substrate. In the case of breakdown of the parasitic diode Dp1 due to an excess voltage surge or the like when the motor is being driven, for example, a current path is generated from the drain to the ground voltage.

Figure 12:
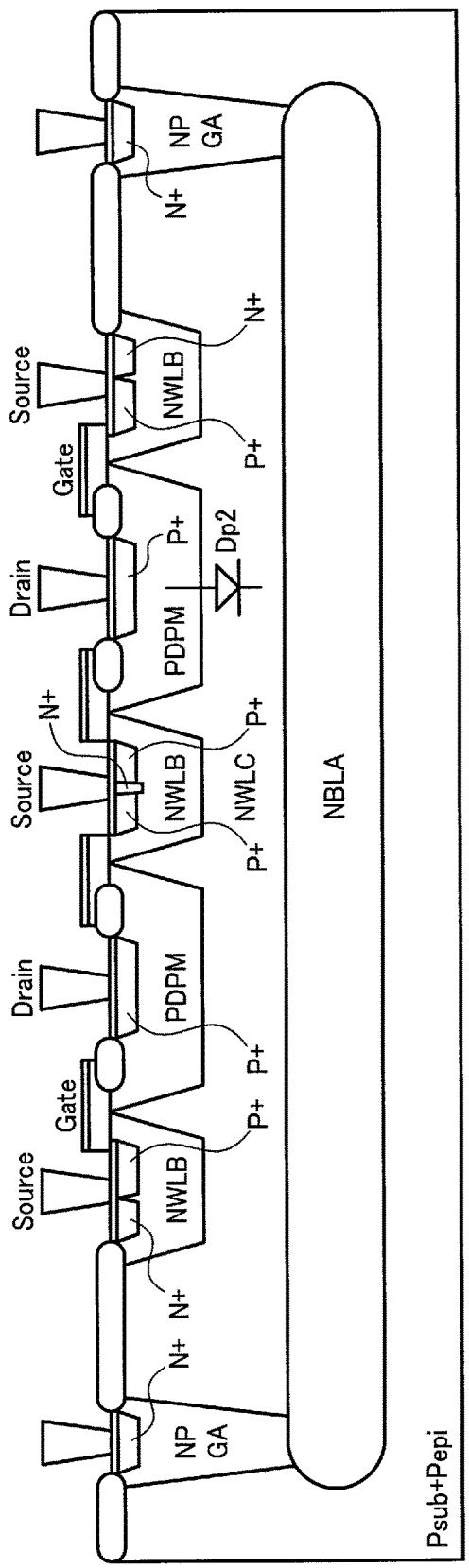
FIG. 12 is a cross-sectional view of a p-type DMOS transistor.

FIG. 12 shows an example of a cross-sectional structure of the high-side transistors Q1 and Q2. In this example, a p-type transistor with a DMOS (Double-Diffused MOSFET) structure is formed on a p-type silicon substrate.

Specifically, an n-type buried layer (NBLA) is formed in the p-type substrate (Psub), a p-type epitaxial layer is formed on the buried layer, and an n-type well (NWLC) is formed in the epitaxial layer. P-type wells (PDPM) are formed in the n-type well, and p-type diffusion layers are formed in the p-type wells so as to form drains. Also, n-type wells (NWLB) are further formed in the n-type wells, and n-type diffusion layers and p-type diffusion layers are formed in the n-type wells so as to form sources.

The p-type substrate is set to the ground voltage. The n-type regions (n-type layers NWLC, NBLA) above are set to the power supply voltage VBB (connected to the node of the power supply voltage VBB) via the n-type wells (NWLB) of the sources. Drains are connected to p-type regions (p-type diffusion layers) and are in contact with the n-type region via the p-type layers (PDPM) below. Therefore, a parasitic diode Dp2 is generated between a drain and the n-type region. In the case of breakdown of the parasitic diode Dp2 due to an excess voltage surge or the like when the motor is being driven, for example, a current path is generated from the power supply voltage VBB to the drain.

8. Electronic Apparatus

Figure 13:
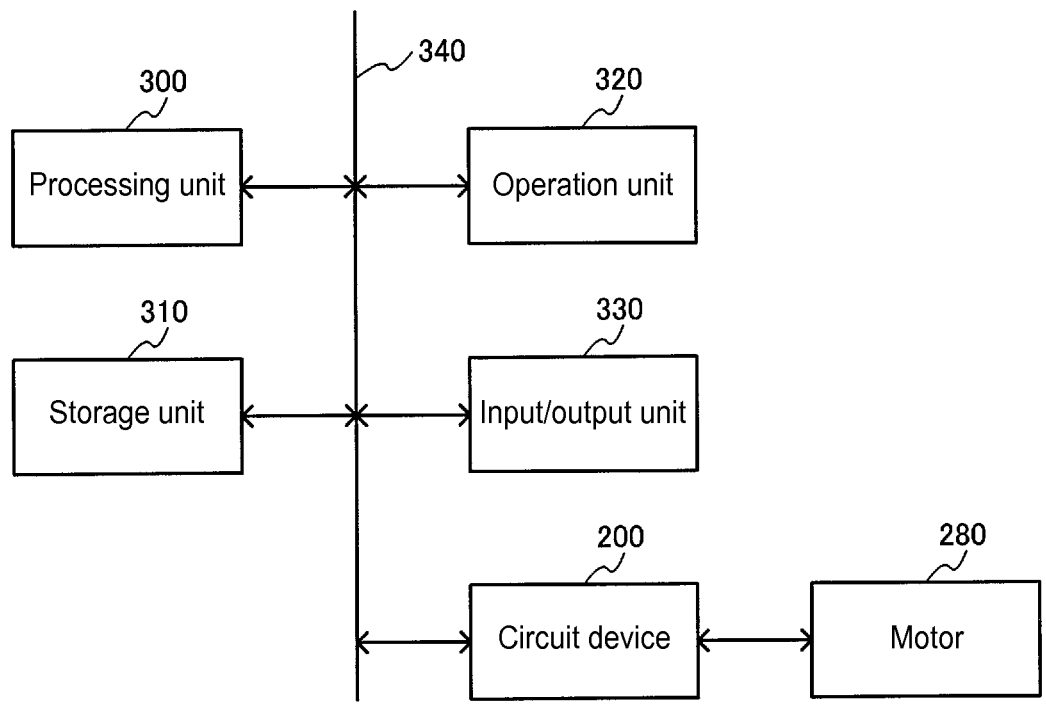
FIG. 13 shows an example of a configuration of an electronic apparatus.

FIG. 13 shows an example of a configuration of an electronic apparatus in which a circuit device 200 of the present embodiment has been applied. The electronic apparatus includes a processing unit 300, a storage unit 310, an operation unit 320, an input/output unit 330, the circuit device 200, bus 340 connecting the units, and a motor 280. The circuit device 200 can be realized using an integrated circuit device, for example.

Hereinafter, a description will be given taking, as an example, a printer that controls movement of a printing head and paper feeding using motor driving, but the present embodiment is not limited thereto, and the present invention can be applied to various types of electronic apparatuses.

The input/output unit 330 is configured by a USB connector, a wireless LAN, or the like, for example, and receives input of image data and document data. The input data is stored in the storage unit 310, which is an internal storage device such as a DRAM, for example. Upon receiving a print instruction from the operation unit 320, the processing unit 300 starts an operation of printing the data stored in the storage unit 310. The processing unit 300 sends an instruction to the circuit device 200 along with the print layout of the data, and the circuit device 200 performs printing head movement and paper feeding by causing the motor 280 to rotate based on the instruction.

Note that although the present embodiment has been described above in detail, it should be apparent to a person skilled in the art that various modifications that do not stray substantially from the novelty and effects of the present invention are possible. Accordingly, these modifications are all intended to be encompassed in the scope of the present invention. For example, in the specification and the drawings, terms written together with different terms that are more widely interpreted or have the same meaning in at least one instance can be replaced with those different terms in all cases in the specification or the drawings. Also, all combinations of the present embodiment and the modifications are also included in the scope of the present invention. Also, the configurations, operations, and the like of the malfunction detection circuit, detection circuit, control circuit, bridge circuit, pre-driver, circuit device, and electronic apparatus are not limited to the description given in the present embodiment, and can be implemented with various modifications.

The entire disclosure of Japanese Patent Application No. 2014-028251, filed Feb. 18, 2014 is expressly incorporated by reference herein.

What is claimed is:

1. A circuit device comprising:
   a bridge circuit having a high-side transistor and a low-side transistor; a malfunction detection circuit configured to detect whether or not a detection voltage, which is a voltage between a drain node and a source node of a detection target transistor that is at least one of the high-side transistor and the low-side transistor, exceeds a given comparison voltage; and
   a control circuit configured to detect a malfunction in a case where it is determined based on a detection result from the malfunction detection circuit that the detection voltage did not exceed the given comparison voltage before completion of a charge period, in which an output current of the bridge circuit is increased
   wherein the malfunction detection circuit has a current supply circuit and a voltage output transistor whose drain receives input of a current from the current supply circuit and whose source is connected to the source of the detection target transistor, and
   the malfunction detection circuit outputs a drain voltage of the voltage output transistor as the given comparison voltage.

2. The circuit device according to claim 1, wherein the given comparison voltage is a voltage that changes according to a setting value for a chopping current, which is the output current of the bridge circuit at completion of the charge period.

3. An electronic device configured to include the circuit device according to claim 2.

4. The circuit device according to claim 1, wherein the control unit determines, at a elapse of a period equal to a past charge period that was monitored or a pre-set period, whether or not the detection voltage exceeds the given comparison voltage based on the detection result from the malfunction detection circuit.

5. An electronic device configured to include the circuit device according to claim 4.

6. The circuit device according to claim 1, wherein the current from the current supply circuit is set according to a setting value for a chopping current, which is the output current of the bridge circuit at completion of the charge period.

7. The circuit device according to claim 6, wherein if a size ratio between the voltage output transistor and the detection target transistor is 1/n, n being a natural number greater than or equal to 2, the malfunction detection circuit sets the current from the current supply circuit to be less than or equal to 1/n the setting value for the chopping current.

8. An electronic device configured to include the circuit device according to claim 7.

9. An electronic device configured to include the circuit device according to claim 6.

10. The circuit device according to claim 1, wherein the malfunction detection circuit has a comparator that is constituted by a transistor with a first breakdown voltage and is configured to compare the detection voltage and the given comparison voltage, and the high-side transistor and the low-side transistor are transistors with a second breakdown voltage that is greater than the first breakdown voltage.

11. The circuit device according to claim 10, wherein
   the malfunction detection circuit has a switch circuit that is constituted by a transistor with the second breakdown voltage and is provided between the drain node of the detection target transistor and an input terminal for the detection voltage of the comparator,
   and the switch circuit is switched off in a decay period in which the output current of the bridge circuit is reduced.

12. An electronic device configured to include the circuit device according to claim 10.

13. The circuit device according to claim 1, wherein
   the control circuit controls switching on and off of the high-side transistor and the low-side transistor, and if the malfunction is detected, stops controlling the switching on and off of the high-side transistor and the low-side transistor.

14. The circuit device according to claim 1, further comprising:
   a detection circuit configured to detect whether or not a current flowing in the bridge circuit has reached a setting value for a chopping current in the charge period,
   wherein in a case where it is detected that the current flowing in the bridge circuit has reached the setting value for the chopping current, the control circuit switches from the charge period to a decay period, in which the output current from the bridge circuit is reached.

15. The circuit device according to claim 1, wherein
   the detection target transistor is the low-side transistor, a substrate of the circuit device is a p-type substrate set to a ground voltage, and
   the drain node of the low-side transistor is connected to an n-type region formed in the p-type substrate.

16. The circuit device according to claim 15, wherein
   the n-type region is formed by an n-type buried layer formed in the p-type substrate and an n-type well formed on the n-type buried layer.

17. The circuit device according to claim 1, wherein
   the detection target transistor is the high-side transistor, a substrate of the circuit device is a p-type substrate,
   an n-type region formed in the p-type substrate is set to the power supply voltage and
   the drain node of the high-side transistor is connected to the p-type region formed in the n-type region.

18. An electronic device configured to include the circuit device according to claim 1.

19. The circuit device according to claim 1, further comprising:
   a detection circuit configured to detect whether or not a current flowing in the bridge circuit has reached a setting value for the a chopping current in a charge period, wherein an output of the malfunction detection circuit is confirmed during a period when an output of the detection circuit is active.

* * * * *